US006815363B2

(12) United States Patent
Yun et al.

(10) Patent No.: US 6,815,363 B2
(45) Date of Patent: Nov. 9, 2004

(54) METHOD FOR NANOMACHINING HIGH ASPECT RATIO STRUCTURES

(75) Inventors: Wenbing Yun, Walnut Creek, CA (US); John Spence, Concord, CA (US); Howard A. Padmore, Berkeley, CA (US); Alastair A. MacDowell, Berkeley, CA (US); Malcolm R. Howells, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 103 days.

(21) Appl. No.: 09/927,428

(22) Filed: Aug. 9, 2001

(65) Prior Publication Data

US 2002/0034879 A1 Mar. 21, 2002

Related U.S. Application Data

(60) Provisional application No. 60/224,730, filed on Aug. 11, 2000.

(51) Int. Cl.$^7$ ............... H01L 21/302; H01L 21/461
(52) U.S. Cl. ............ 438/710; 438/714; 438/715; 438/718; 438/719; 438/723; 438/724; 438/725
(58) Field of Search ............... 438/710, 714, 438/715, 718, 719, 723, 724, 725, 153, 177, 252, 257–267, 597, 706, 722, 314–316

(56) References Cited

U.S. PATENT DOCUMENTS

| | | | | |
|---|---|---|---|---|
| 4,104,085 A | * | 8/1978 | Zandveld | 148/1.5 |
| 4,976,818 A | * | 12/1990 | Hashimoto et al. | 156/643 |
| 5,723,387 A | * | 3/1998 | Chen | 438/692 |
| 5,817,580 A | * | 10/1998 | Violette | 438/704 |
| 6,114,233 A | * | 9/2000 | Yeh | 438/622 |
| 6,207,517 B1 | * | 3/2001 | Muller | 438/301 |
| 6,271,127 B1 | * | 8/2001 | Liu et al. | 438/638 |
| 6,444,136 B1 | * | 9/2002 | Liu et al. | 216/62 |

OTHER PUBLICATIONS

Hambach, D., Schneider, G. and Gullikson, E.M., "Efficient High–Order Diffraction of Extreme–Ultraviolet Light and Soft X–Rays by Nanostructured Volume Gratings," Optics Letters, vol. 26, No. 15, pp. 1200 thru 1202, Aug. 1, 2001.

Schneider, G., "Zone Plates with High Efficiency in High Orders of Diffraction Described by Dynamical Theory," Applied Physics Letters, pp. 2242 thru 2244, vol. 71, No. 16, Oct. 20, 1997.

Aristov, V.V. and Erko, A.I., (eds.) "Theoretical Description of the Diffraction Properties of Zone Plates wiht Small Outermost Zone Width," pp. 523 thru 530, X–Ray Microscopy IV, Proceedings of the 4th International Conference, Chernogolovka, Russia, Sep. 20–24, 1993.

Price, P.B., Walker, R.M., "Chemical Etching of Charged–Particle Tracks in Solids," Journal of Applied Physics, vol. 33, No. 12, pp. 3407–3412, Dec., 1962.

(List continued on next page.)

Primary Examiner—Duy-Vu Deo
(74) Attorney, Agent, or Firm—John P. O'Banion

(57) ABSTRACT

A nanomachining method for producing high-aspect ratio precise nanostructures. The method begins by irradiating a wafer with an energetic charged-particle beam. Next, a layer of patterning material is deposited on one side of the wafer and a layer of etch stop or metal plating base is coated on the other side of the wafer. A desired pattern is generated in the patterning material on the top surface of the irradiated wafer using conventional electron-beam lithography techniques. Lastly, the wafer is placed in an appropriate chemical solution that produces a directional etch of the wafer only in the area from which the resist has been removed by the patterning process. The high mechanical strength of the wafer materials compared to the organic resists used in conventional lithography techniques with allows the transfer of the precise patterns into structures with aspect ratios much larger than those previously achievable.

74 Claims, 1 Drawing Sheet

OTHER PUBLICATIONS

Bean, C.P., Doyle, M.V., and Entine, G., "Etching of Submicron Pores in Irradiated Mica," Journal of Applied Physics, vol. 41, No. 4, pp. 1454–1459, Mar. 15, 1970.

Osmonics, "Poretics Polycarbonate Screen Membranes (PCTE)—13mm," http://www.osmolabstore.com/script-s.OsmoLabPage.dll?Build, pp 1 thru 11, Aug. 6, 2001.

* cited by examiner

METHOD FOR NANOMACHINING HIGH ASPECT RATIO STRUCTURES

CROSS-REFERENCE TO RELATED APPLICATIONS

This application claims priority from U.S. provisional application Ser. No. 60/224,730 filed on Aug. 11, 2000, incorporated herein by reference.

STATEMENT REGARDING FEDERALLY SPONSORED RESEARCH OR DEVELOPMENT

This invention was made with U.S. Government support under Contract No. DE-AC03-76SF00098 between the U.S. Department of Energy and the University of California for operation of Lawrence Berkeley Laboratory. The government may have certain rights in this invention.

REFERENCE TO A COMPUTER PROGRAM APPENDIX

Not Applicable

BACKGROUND OF THE INVENTION

1. Field of the Invention

This invention pertains generally to nano-machining, and more specifically to nano-machining precise structures with a high ratio of thickness to feature size (also known as a high "aspect ratio").

2. Description of the Background Art

The need to machine structures of ever-decreasing dimensions is driven by many factors. One factor is that many materials at reduced dimensions exhibit unique physical properties that can be utilized effectively. An example is a quantum device. Another factor is that greatly improved performance can be obtained from precisely machined fine structures. For example, sensors and detectors with better sensitivity can be developed with structures of reduced dimensions. Furthermore, sufficiently miniaturized devices may have unique applications, such as medical implant and surgical devices. Additionally, the integration and dense packing of many miniature devices in one enclosure is often required to improve device performance in functionality or compactness.

Heretofore, several techniques have been used in the fabrication of precise structures with small features. Each technique has its own unique application with its associated limitations. For example, conventional electron or focused ion beam lithography is both capable of fabricating precise structures with feature sizes as small as 10 nm over a large area, but the aspect ratio of the nano-structures is limited to less than five due mostly to the difficulty of the transferring the pattern generated by electron beam writing machines to the desired material. X-ray lithography is used to make precise nano-structures with an improved aspect ratio compared to the e-beam or focused ion beam lithography but the small feature size is more limited. For an aspect ratio of ten, the achievable feature size is closer to 100 nm. The recently developed lithographic galvanoformung abformung (LIGA) technique is capable of producing microstructures with an aspect ratio as high as several hundred, but there the smallest feature size is limited to approximately 2 $\mu$m.

One particular application requiring high aspect ratio nano-structures is the fabrication of zone plate lenses that comprise sets of concentric rings whose width decreases linearly with distance from the center. The rings are often made of alternating open slots and solid material. In fact, the rings do not need to be continuous, and the open slots can be solid material rings containing many holes and the solid material can be many dots.

Zone plates are among the most promising lenses being developed for x-ray applications. In the soft x-ray spectral region (roughly 0.1–1 keV), zone plates with the smallest zone width of approximately 20 nm and aspect ratios up to approximately five have been made using e-beam lithography and are being used for various imaging techniques. Zone plates have been used to produce images with a spatial resolution of approximately 25 nm. In fact, the spatial resolution is the best obtained in any imaging microscope using electromagnetic radiation, e.g., from extreme ultraviolet to visible light. Theory shows that the best resolution obtainable with a zone plate is equal to the outermost zone width, which is the smallest. Therefore, the ability to make precise zone plate structures with smaller zones thus improves directly the spatial resolution. However, the zone plate structure must have an adequate thickness in order to achieve an optimal focusing efficiency.

Although a sputtering/slicing technique which, in principle, is capable of producing high aspect ratio zone plates with spatial resolution approaching 10 nm, was proposed long ago, it has not reached its goal, and nearly all zone plates in use today with a spatial resolution better than 100 nm for soft x-ray (energy <1 keV) are fabricated using various forms of an electron beam lithographic technique. For applications to x-ray energy greater than 1 keV, the aspect ratio required for optimal focusing efficiency increases with x-ray energy and the fabrication method successfully used for soft x-ray zone plates (electron bean lithography) can't be used directly for producing zone plates of high resolution and high focusing efficiency for higher energy applications. Higher energy x-rays are often necessary for nondestructive imaging and examination of large objects or objects containing sufficiently large fraction of high atomic number elements. For example, a minimum x-ray energy of approximately 5 keV is required to have sufficient transmission through a 12-micron thick integrated circuit made of approximately 30% Cu and low atomic number elements. For 8 keV x-ray applications and assuming Au is the zone construction material, which yields close to the minimum aspect ratio required for a given focusing efficiency, a zone-plate needs to have an aspect ratio of approximately sixteen, forty eight, and one hundred sixty for the outermost zone width to be approximately 100 nm, 33 nm, and 10 nm, respectively. These required aspect ratios significantly exceeds the capabilities of the fabrication techniques hitherto, especially for the smaller outermost zone widths. The problem is worse for x-ray energies greater than 8 KeV.

Therefore, there is a need for a method for fabricating precise high aspect ratio nanometer structures. The present invention satisfies that need, as well as others, and overcomes limitations in conventional fabrication methods.

BRIEF SUMMARY OF THE INVENTION

In general terms, the present invention is a method for "nano-machining via particle-track-guided-etching of precise patterns". The invention combines (i) the precise nanostructure-patterning capability of electron beam lithography with (ii) the high aspect ratio nano-machining capability of a particle track etching method that employs a highly enhanced etching rate along particle tracks, which is analogous to machining by a drill bit of a nanometer sized diameter. More specifically, a lithographically generated pattern is used as a negative or positive mask defining etching areas, and the particle track etching method etches the unmasked areas along the directions guided by the particle tracks. The advantages of the invention for producing high aspect ratio nanostructures may also rest on the high mechanical strength of the wafer materials (e.g., insulators or semiconductors) compared to the organic resists used in conventional lithography techniques.

By way of example, and not of limitation, in accordance with the present invention a wafer, such as an insulator or semiconductor, is irradiated with a particle beam of suitable energy to break the chemical bonds of the material (e.g., radiation damage) and having a predetermined collimation at a desired direction with respect to the wafer surface. This step produces particle tracks for guiding the high aspect ratio nano-machining by particle track etching that will take place in a later processing step. Next, a thin layer of suitable patterning material such as e-beam resist is deposited on one side of the wafer, and an etch-stop layer of suitable material for preventing the etching of the particle tracks by the chemical solution used in a later step may be coated on the other side of the wafer. A desired pattern is then generated in the patterning material (e.g., e-beam resist) on the top surface of the irradiated wafer using conventional precise pattern generation techniques (e.g., electron or ion beam lithography), such that the patterning material is removed in selective areas thereby exposing the wafer surface. Removal of the patterning material would typically be carried out by etching via a chemical solution or reactive ion or other established technique. For example, the wafer would be placed in an appropriate chemical solution that etches along the direction(s) of the particle tracks over the areas that are not covered by the patterning material.

The etch rate along the particle tracks can be more than one-thousand times faster than the etch rate of materials not within the immediate vicinity of the particle tracks. The etched particle track area may have a diameter as small as 5 nm and a length as long as many thousand nm along the direction(s) of the particle tracks, depending on the wafer material, the charge, mass, and energy of the particles, and the etchant and the etching conditions. For example, the type and strength of the etching chemicals and etching time determines the length and diameter of the particle tracks for a given wafer material.

The structure in the area not covered by the patterning material after the etching process may contain isolated holes or closely connected holes thereby producing continuous lines, depending on the wafer material, particle density used in the irradiation process and etching conditions. The etched high aspect ratio precise structure in the wafer is one form of the final product. It can also be used for furthering processing such as a negative for molding via electroforming.

The present invention can be used to manufacture components for a wide range of applications, including miniaturized electromechanical devices and optical components. For example, it overcomes the main technical problems in fabricating high-resolution and high-focusing-efficiency zone plates and other optics for x-ray applications, namely, fabricating high aspect ratio nanostructures with precise zone plate pattern. This is achieved by using the process of the nanomachining via particle-track-guided-etching of precise patterns. Therefore, the invention disclosed here can be applied to produce zone plates with both high spatial resolution and focusing efficiency. For example, the invention can be used to fabricate zone plates with zone width as small as 5 nm with an aspect ratio up to one thousand and with a diameter several millimeters. Such zone plates can be used for many imaging and focusing applications for x-ray energies up to 70 keV with high spatial resolution and high focusing efficiency. Other x-ray optical components such as gratings and resolution test standards can also be made using the process of the nanomachining via particle-track-guided-etching of precise patterns. The invention can also be used as a machining method for removing gross areas of materials. Additionally, the invention can be used for machining three-dimensional products.

Further advantages of the invention will be brought out in the following portions of the specification, wherein the detailed description is provided for the purpose of fully disclosing preferred embodiments of the invention without placing limitations thereon.

BRIEF DESCRIPTION OF THE DRAWINGS

The invention will be more fully understood by reference to the following drawings, which are for illustrative purposes only, wherein like reference numbers denote like elements.

DETAILED DESCRIPTION OF THE INVENTION

Referring more specifically to the drawings, for illustrative purposes the present invention is embodied in the method generally shown in FIG. 1A through FIG. 1E. It will be appreciated that the specific steps and sequence of the method may vary without departing from the basic concepts as disclosed herein.

In general terms, the present invention comprises a particle-track-guided-etching method for nanomachining a precise structure with a high aspect ratio. The structure is defined by a precise masking pattern that is generated on a wafer using conventional lithographic patterning techniques. FIG. 1A through FIG. 1E illustrates in cross-section a wafer 10 being processed according to an embodiment of the method of the present invention.

Figure 1A:
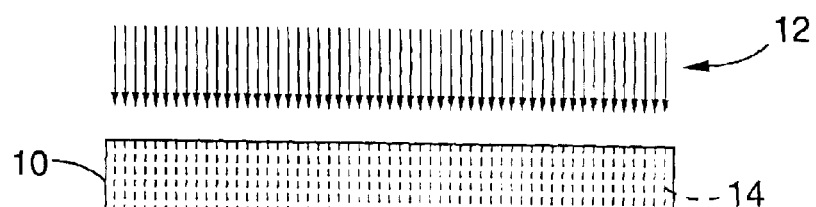
FIG. 1A through FIG. 1E is a flow diagram illustrating, in cross-section, a wafer undergoing the inventive process.

Step 1. Referring first to FIG. 1A, the method begins by irradiating wafer 10, which may comprise an insulator or semiconductor, with an energetic charged particle beam 12 of predetermined collimation and direction with respect to the surface of the wafer. The passage of the particles through the material generates a strong electromagnetic field that breaks chemical bonds within its immediate vicinity along the particle tracks 14. The particle beam can be generated in a conventional manner, such as by removing some or all electrons from neutral atoms by an accelerator, or can be in the form of alpha particles emitted from a radioactive source. Most insulators or semiconductors as suitable materials for forming particle tracks can be found in P. B. Price and R. M. Walker, "Chemical Etching of Charged-Particle Tracks in Solids", Journal of Applied Physics, Vol. 33, No. 12, pp. 3407–3412, December 1962, incorporated herein by reference.

Etchable tracks can be formed in bulk inorganic crystals and certain glasses and high polymers. Generally speaking, the materials must be insulators or weak semiconductors with resistivity above approximately $10^4$ ohm/cm. Therefore, metals or silicon or germanium would not typically be suitable materials for particle track etching. The range of useful resistivity is wider for thin films, although thin films may not be suitable for most products. Preferred materials, having well-controlled shapes and engineerable characteristics, include quartz crystals, silica glasses, and mica.

While bond strengths between atoms in a solid are typically on the order of 5 eV, the particle beam energy is preferably much higher. In general, the requirement is a sufficient number of ion pairs per unit track length that the ions will penetrate the wafer to the desired depth and preferably all of the way through the wafer. It will be appreciated that mass and particle charge will affect penetration depth. For example, for substrates that are a few microns thick, the energy should be at least approximately 0.5 MeV to approximately 2.5 MeV per nucleon for ions between argon and krypton. For 5 micron thick mica, 100 MeV argon ions is the preferred energy level.

The line of the radiation-damaged material can then be preferentially etched by suitable chemical solutions, thus providing the mechanism of particle-track-guided etching. While the depth of the particle tracks can be controlled by adjusting the particle beam energy level, the final length of the etched tracks can also be controlled by the etching solutions and etching conditions. One such example is that the etched tracks are complete through-holes from the irradiated surface to an etch stop layer on the opposite surface.

The density of the particle tracks, as well as the etching solution and etching conditions, can be controlled to make the tracks essentially collapse during etching or form isolated holes. This allows deep etching of very small areas (e.g., as small as 5 nm in diameter) with near vertical walls. The density of the particle tracks is proportional to the product of the flux of the particle beam and the irradiation time. For example, for a track separation of 20 nm where the etched holes will merge, 40 holes per micron of length would be sufficient. The total exposure (total fluence) would be 1600 ions per square micron ($1.6 \times 10^{11}$ ions per square cm). A particle accelerator can easily generate $1.6 \times 10^{19}$ singly-charged ions per second over a few square mm with one ampere of current can easily provide that level of exposure.

Therefore, parameters for determining the final structure include the density of the particle tracks, the etching solution, and the etching conditions for a given wafer material.

It will also be appreciated that particle track density and preciseness is affected by beam dispersion. Therefore, the particle beam is preferably collimated and directed to the surface of the wafer with a desired orientation. For example, by orienting the wafer in relation to the particle beam or vice versa, the direction of the beam could be perpendicular to the surface of the wafer or at some angle less than ninety degrees in relation to the plane of the surface to form particle tracks that are aligned substantially parallel to each other. Alternatively, the particle beam can be oriented and/or collimated in such a way that the particle tracks are extended so that they intercept at a substantially small point, a condition that can be realized when the particles originate from a point source or an effective point source via focusing. Other orientations and beam divergence properties can be used as well.

Figure 1B:
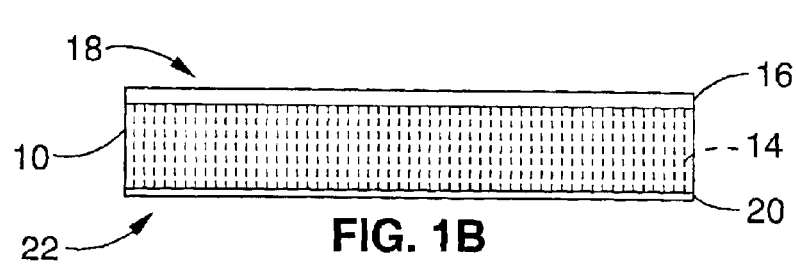

Step 2. Referring to FIG. 1B, a layer of suitable patterning material 16, such as electron beam (e-beam) resist or other organic resist material, is then deposited on the irradiated side 18 of the wafer 10. The layer of patterning material can be deposited in any conventional manner, such as by spinning or vacuum coating, and can comprise a single layer or a multilevel layer. In the case of a multilevel layer, which can improve the aspect ratio of electron beam lithography, the sublayers can be of the same material or dissimilar materials. In all cases, the layer of resist material should be suitable for producing an etching pattern and be structurally stable during subsequent etching.

The patterning material is designed for both producing the desired pattern and acting as a mask for the subsequent processing steps, especially the particle track etching step.

Step 3. A layer of etch stop 20 is then coated on the side 22 of the wafer that is opposite to the side of the wafer onto which the particles are incident. The purpose of the etch stop is to ensure the etchant only etches from the side of the wafer where the etching pattern 24 is formed as described in Step 4 below.

Figure 1C:
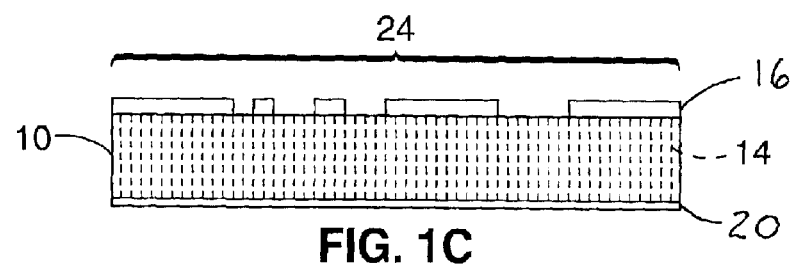
Figure 1D:
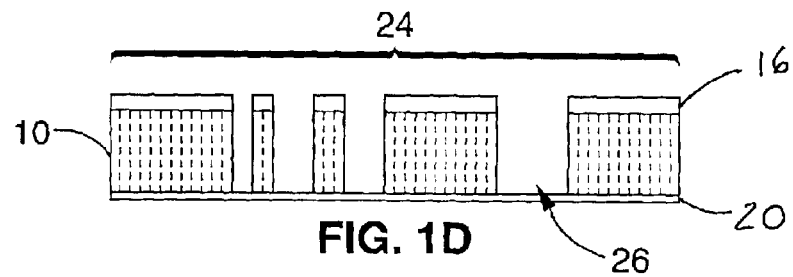

Step 4. Referring to FIG. 1C, a desired pattern 24 is then generated on the irradiated side 18 of wafer 10 using conventional precise pattern generation techniques such as electron beam lithography. For example, the pattern can be written using an electron beam writing machine or the like. It will be appreciated that this step results in portions of the pattern forming result material being selectively removed such that a precise pattern for etching is produced. Different from the conventional e-beam lithography, the resist layer must be adequately stable during subsequent processing, namely etching, only the areas of the wafer that are not covered by the precise pattern of resist material will be etched.

Step 5. Lastly, referring to FIG. 1D, the wafer 10 is placed in an appropriate chemical solution that etches out the particle tracks 14 only in the areas 26 that are not covered by the pattern 24. Note that, due to the density of the particle tracks in the area to be etched, particle tracks essentially "collapse" to provide high aspect ratio etching.

It will be appreciated that the material that forms the pattern 24, namely e-beam resist 16 or the like, is suitably resistant to the etchant such that the particle tracks under it are not etched. By selecting the particle track density and etching conditions, a high aspect ratio nanostructure close to the pattern 24 may be produced. In many cases, such as the case of zone plates, the etched areas in the final product may contain only isolated holes instead of continuing lines similar to the pattern 24.

Typically, etching is carried out by immersing the wafer in an etching solution such as a solvent or the like to partially or completely transfer the etching pattern to the wafer with an aspect ratio substantially greater than that in the etching pattern. Alternatively, plasma based etching or the like may be employed. Furthermore, in the case of a multilevel layer where the sublayers are dissimilar materials, a combination of solvent and plasma based etching may be employed. Etching can be accomplished using established techniques, such as described in C. P. Bean, M. V. Doyle, and G. Entine, "Etching of Submicron Pores in Irradiated Mica", Journal of Applied Physics, Vol. 41, No. 4, pp.1454–1459, 15 March 1970, incorporated herein by reference. Also see, P. B. Price and R. M. Walker, "Chemical Etching of Charged-Particle Tracks in Solids", Journal of Applied Physics, Vol. 33, No. 12, pp. 3407–3412, December 1962, incorporated herein by reference.

Figure 1E:
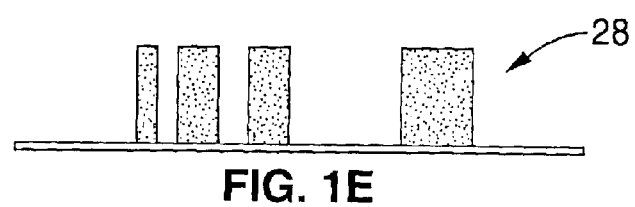

Step 6. The structure formed after carrying out Step 5 (FIG. 1D) may be the final form of the desired product. Optionally, the structure of FIG. 1D can be used as a negative for a complementary final structure. In that case, subsequent processing, such as electroforming (e.g., electroplating), would be carried out to form the final structure 28 shown in FIG. 1E.

Where the structure shown in FIG. 1E is to be formed by electroforming, etch stop layer 20 can be an electroplating base layer and serve as the anode for electroplating or the like. Alternatively, etch stop layer 20 can also act as an electroplating base layer, such as Au when the etching solution is suitably diluted HF acid and the wafer material is mica.

Accordingly, the present invention comprises a nanomachining process using particle-track-guided-etching of precise patterns generated by conventional lithography techniques to manufacture precise nanostructures over a large area with much higher aspect ratios than that are possible hitherto. The invention combines the capability of the precise nanostructure-patterning capability of the electron beam lithography technique with the high aspect ratio nanomachining capability of a particle track etching method. By employing the present invention, it should be possible to fabricate x-ray zone plates with a 10 nm spatial resolution and focusing efficiency of 30% or greater. In addition the present invention offers a pathway to zone plates with a blazed zone profile that can be used in the x-ray spectral region as a Fresnel lens is used in the visible light region. This would enable fabrication of Bragg-effect zone plates analogous to Bragg-effect holograms. In addition, the invention can be used for gross removal of areas of a material.

In principle, a three-dimensional structure can be fabricated by repeating the nanomachining process described above. This may be accomplished by several methods. One method involves generating a structured mask that will expose a series of predetermined patterns of the particle tracks on the wafer surface. One design of this mask comprises one patterning material with desired predetermined thickness levels (e.g., a staircase) with each thickness level representing one of the predetermined patterns. By controlling processing time, each of the predetermined patterns suitable for etching can be revealed at the desired processing stage. The processing steps between the processing for making any two predetermined patterns suitable for particle track etching may comprise only an etching the particle tracks to a predetermined depth (length) or a multiple-stage processing involving etching the particle tracks and electroplating of the etched tracks. Another design of the mask comprises mask patterns which are made of different materials that can be etched with suitable processes to reveal a desired mask pattern during the overall nanomachining processes with intermediate steps similar to those described above.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A particle-track-guided etching method for nanomachining a precise structure with a high aspect ratio, comprising:

irradiating the surface of a wafer with a charged particle beam of suitable energy to form particle tracks in said capable of discrete etching guided by said particle tracks in said wafer with a desired depth and alignment;

depositing a layer of pattern forming resist material on the wafer surface irradiated by said particle beam;

generating a precise pattern on the pattern forming layer;

etching the areas of said wafer that are not covered by the precise pattern;

wherein said etching is guided by said particle tracks;

wherein said charged particle beam is directed to said surface of said wafer with a predetermined collimation at a desired direction; and wherein the level of said suitable energy exceeds 0.5 MeV.

2. A method as recited in claim 1, wherein said etched wafer comprises a final nanomachined structure.

3. A method as recited in claim 1, wherein said etched wafer comprises a negative of a final nanomachined structure.

4. A method as recited in claim 3, wherein said final nanomachined structure is formed by electroforming using said negative.

5. A method as recited in claim 4, wherein said electroforming comprises electroplating.

6. A method as recited in claim 1, wherein said wafer comprises a semiconductor material.

7. A method as recited in claim 1, wherein said wafer comprises an insulator material.

8. A method as recited in claim 1, wherein said charged particle beam is produced by removing some or all electrons from neutral atoms by an accelerator or consists of alpha particles emitted from a radioactive source.

9. A method as recited in claim 1, wherein said irradiating of said wafer comprises placing said wafer in said particle beam in a desired direction with respect to the wafer surface.

10. A method as recited in claim 9, wherein said desired direction is perpendicular to the wafer surface.

11. A method as recited in claim 9, wherein said desired direction has an angle of less than ninety degrees with respect to the plane of the wafer surface.

12. A method as recited in claim 1, wherein said particle tracks are substantially parallel to each other.

13. A method as recited in claim 1, wherein said particle tracks are oriented to intercept at a substantially small point if extended.

14. A method as recited in claim 1, wherein said step of depositing a layer of resist material over said irradiated surface of said wafer comprises deposition of a single or multilevel resist layers using spinning or vacuum coating.

15. A method as recited in claim 1, wherein said layer of resist material is suitable for producing said etching pattern and is stable during said etching step.

16. A method as recited in claim 1, wherein said step of selectively removing portions of said layer of resist material to generate an etching pattern on irradiated surface of said wafer comprises writing a pattern on said layer of resist material using an electron beam writing machine and subsequent processing to produce the desired pattern.

17. A method as recited in claim 16, wherein said subsequent processing comprises dissolution of selective portions of said layer of resist material using a solvent.

18. A method as recited in claim 16:
wherein said layer of resist material comprises sublayers of dissimilar materials; and
wherein said subsequent processing comprises dissolution of selective portions of said layer of resist material using a solvent and plasma based etching.

19. A method as recited in claim 1, wherein said layer of resist material comprises a single layer of organic resist material.

20. A method as recited in claim 1, wherein said layer of resist material comprises electron beam resist.

21. A method as recited in claim 1, wherein said layer of resist material comprises a multilevel resist structure established for improving the aspect ratio of electron beam lithography.

22. A method as recited in claim 1:
wherein said etching of said wafer comprises immersing said wafer in an etching solution;
wherein said etching pattern is partially or completely transferred to the wafer;
wherein said etching forms an etched portion of said wafer;
wherein said etched portion of said wafer has an aspect ratio substantially greater than one; and
wherein said aspect ratio comprises the ratio of the depth of the etched particle track to the width of the smallest etched portion of said etching pattern.

23. A method as recited in claim 22, wherein said etched wafer comprises a final nanomachined structure.

24. A method as recited in claim 22, wherein said etched wafer comprises a negative of a final nanomachined structure.

25. A method as recited in claim 24, wherein said final nanomachined structure is formed by electroforming using said negative.

26. A method as recited in claim 25, wherein said electroforming comprises electroplating.

27. A particle-track-guided-etching method for nanomachining a precise structure with a high aspect ratio, comprising:
irradiating a wafer with a charged particle beam of suitable energy and predetermined collimation at a desired direction with respect to said wafer surface to form particle tracks capable of discrete etching guided by said particle tracks in said wafer with a desired depth and alignment;
depositing a layer of pattern forming resist material on the wafer surface irradiated by the particle beam;
generating a precise pattern on the pattern forming layer; and
etching the areas of wafer that are not covered by the precise pattern;
wherein said etching is guided by said particle tracks;
wherein said irradiating of said wafer comprises placing said wafer in said particle beam in a desired direction with respect to the wafer surface; and
wherein the level of said suitable energy exceeds 0.5 MeV.

28. A method as recited in claim 27, wherein said etched wafer comprises a final nanomachined structure.

29. A method as recited in claim 27, wherein said etched wafer comprises a negative of a final nanomachined structure.

30. A method as recited in claim 29, wherein said final nanomachined structure is formed by electroforming using said negative.

31. A method as recited in claim 30, wherein said electroforming comprises electroplating.

32. A method as recited in claim 27, wherein said wafer comprises a semiconductor material.

33. A method as recited in claim 27, wherein said wafer comprises an insulator material.

34. A method as recited in claim 27, wherein said charged particle beam is produced by removing some or all electrons from neutral atoms by an accelerator or consists of alpha particles emitted from a radioactive source.

35. A method as recited in claim 27, wherein said desired direction is perpendicular to the wafer surface.

36. A method as recited in claim 27, wherein said desired direction has an angle of less than ninety degrees with respect to the plane of the wafer surface.

37. A method as recited in claim 27, wherein said particle tracks are substantially parallel to each other.

38. A method as recited in claim 27, wherein said particle tracks are oriented to intercept at a substantially small point if extended.

39. A method as recited in claim 27, wherein said step of depositing a layer of resist material over said irradiated surface of said wafer comprises deposition of a single or multilevel resist layers using spinning or vacuum coating.

40. A method as recited in claim 27, wherein said layer of resist material is suitable for producing said etching pattern and is stable during said etching step.

41. A method as recited in claim 27, wherein said step of selectively removing portions of said layer of resist material to generate an etching pattern on irradiated surface of said wafer comprises writing a pattern on said layer of resist material using an electron beam writing machine and subsequent processing to produce the desired pattern.

42. A method as recited in claim 41, wherein said subsequent processing comprises dissolution of selective portions of said layer of resist material using a solvent.

43. A method as recited in claim 41:
wherein said layer of resist material comprises sublayers of dissimilar materials; and
wherein said subsequent processing comprises dissolution of selective portions of said layer of resist material using a solvent and plasma based etching.

44. A method as recited in claim 27, wherein said layer of resist material comprises a single layer of organic resist material.

45. A method as recited in claim 27, wherein said layer of resist material comprises electron beam resist.

46. A method as recited in claim 27, wherein said layer of resist material comprises a multilevel resist structure established for improving the aspect ratio of electron beam lithography.

47. A method as recited in claim 27:
wherein said etching of said wafer comprises immersing said wafer in an etching solution;
wherein said etching pattern is partially or completely transferred to the wafer;
wherein said etching forms an etched portion of said wafer;

wherein said etched portion of said wafer has an aspect ratio substantially greater than one; and wherein said aspect ratio comprises the ratio of the depth of the etched particle track to the width of the smallest etched portion of said etching pattern.

48. A method as recited in claim 47, wherein said etched wafer comprises a final nanomachined structure.

49. A method as recited in claim 47, wherein said etched wafer comprises a negative of a final nanomachined structure.

50. A method as recited in claim 49, wherein said final nanomachined structure is formed by electroforming using said negative.

51. A method as recited in claim 50, wherein said electroforming comprises electroplating.

52. A method for nanomachining a precise structure by particle-track-guided-etching comprising:
   irradiating the surface of a wafer with a charged particle beam of suitable energy to form particle tracks capable of discrete etching guided by said particle tracks in said wafer;
   depositing a layer of resist material over said irradiated surface of said wafer;
   selectively removing portions of said lever of resist material to generate an etching pattern on irradiated surface of said wafer; and
   etching said wafer according to said etching pattern;
   wherein said etching is guided by said particle tracks; and
   wherein said level of said suitable energy for creating particle tracks is at least approximately 0.5 MeV.

53. A method as recited in claim 52, wherein said particle tracks are generated substantially parallel to each other.

54. A method as recited in claim 52, wherein said particle tracks are oriented to intercept at a substantially small point if extended.

55. A method as recited in claim 52, wherein said wafer substantially comprises a material selected from the group consisting essentially of quartz crystal, silica glass and mica.

56. A method as recited in claim 52, further comprising applying an etch stop material to the surface of said wafer opposite the surface deposited with said layer of resist material.

57. A method for nanomachining a precise structure by particle-track-guided-etching comprising:
   irradiating the surface of a wafer with a charged particle beam of suitable energy to form particle tracks capable of discrete etching guided by said particle tracks in said wafer;
   depositing a layer of resist material over said irradiated surface of said wafer;
   selectively removing portions of said layer of resist material to generate an etching pattern on irradiated surface of said wafer; and
   etching said wafer according to said etching pattern;
   wherein said etching is guided by said particle tracks;
   wherein said precise structure being nanomachined comprises a zone plate structure for x-ray applications beyond one thousand electron volts;
   wherein said etching pattern is a zone plate pattern having a width of at least about five nanometers;
   wherein the aspect ratio of the depth of the etched particle track compared to the width of the smallest zone plate pattern is at least about ten; and
   wherein said zone plate structure has a diameter of at least about one millimeter.

58. A method for nanomachining a precise structure by particle-track-guided-etching comprising:
   irradiating the surface of a wafer with a charged particle beam of suitable energy to form particle tracks capable of discrete etching guided by said particle tracks in said wafer;
   depositing a layer of resist material over said irradiated surface of said wafer;
   selectively removing portions of said layer of resist material to generate an etching pattern on irradiated surface of said wafer; and
   etching said wafer according said etching pattern;
   wherein said etching is guided by said particle tracks;
   wherein said precise structure being nanomachined comprises a mica wafer up to approximately five microns thick; and
   wherein said charged particle beam is a beam of charged argon ions with a potential of at least about one hundred million electron volts per nucleon.

59. A method for nanomachining a precise structure with a high aspect ratio by particle-track-guided-etching, comprising:
   irradiating a first surface of a wafer with a charged particle beam of suitable energy to form particle tracks capable of discrete etching guided by said particle tracks in said wafer with a desired depth and alignment;
   depositing a layer of pattern forming resist material on said first surface of said wafer irradiated by said particle beam;
   generating a precise pattern on said pattern forming layer; and
   etching guided by said particle tracks under areas of said wafer that are not covered by said precise pattern;
   wherein the aspect ratio of the depth of the particle track etched, compared to the width of smallest area not covered by said etching pattern, is at least about ten; and
   wherein said aspect ratio is on the order of one thousand.

60. A method as recited in claim 59, wherein said pattern forming resist material is an e-beam resist material.

61. A method as recited in claim 59, wherein said pattern forming resist material comprises a multilevel resist structure established for improving the aspect ratio of the depth of the particle track etched, compared to the width of smallest area not covered by said pattern forming resist material.

62. A method as recited in claim 59, wherein an etch stop material is applied to a second surface of said wafer.

63. A method as recited in claim 59, wherein said pattern forming resist material is suitable for removing portions as small as five nanometers in width.

64. A method as recited in claim 59, wherein said particle tracks are oriented to substantially intercept within the wafer.

65. A method as recited in claim 59, wherein said wafer comprises a semiconductor material.

66. A method as recited in claim 59, wherein said wafer comprises an insulator material.

67. A method as recited in claim 59, wherein said wafer substantially comprises a material selected from the group consisting essentially of quartz crystal, silica glass and mica.

68. A method for nanomachining a precise structure with a high aspect ratio particle-track-guided-etching, comprising:
   irradiating a first surface of a wafer with a charged particle beam of suitable energy to form particle tracks capable of discrete etching guided by said particle tracks in said wafer with a desired depth and alignment;

depositing a layer of pattern forming resist material on said first surface of said wafer irradiated by said particle beam;

generating a precise pattern on said pattern forming layer; and etching guided by said particle tracks under areas of said wafer that are not covered by said precise pattern;

wherein the aspect ratio of the depth of the particle track etched, compared to the width of smallest area not covered by said etching pattern, is at least about ten; and wherein said suitable energy to form said particle tracks is at least about five hundred thousand electron volts.

69. A method for nanomachining a zone plate structure by particle-track-guided-etching to produce a zone plate for focusing x-rays comprising:

irradiating the surface of an insulator or semiconductor wafer with a collimated charged particle beam of at least about 0.5 MeV energy and forming particle tracks capable of discrete etching guided by said particle tracks in said wafer;

depositing a layer of electron beam resist material over said irradiated surface of said wafer;

depositing a layer of etch stop over said surface of said wafer opposite said layer of etch stop;

generating a zone plate pattern on said layer of resist material by selectively removing portions of said zone plate pattern with electron beam lithography;

immersing said wafer in etching solution; and etching, guided by said particle tracks, portions of said wafer exposed by said zone plate pattern.

70. The method as recited in claim 69, wherein said zone plate has an outermost zone with a width of at most about 100 nanometers; and wherein said zone plate has an aspect ratio greater than one;

said aspect ratio comprising the ratio of the thickness of the zone plate to the width of the outermost zone.

71. The method as recited in claim 70, wherein said zone plate has an aspect ratio of at least about 16.

72. The method as recited in claim 71:

wherein said zone plate has an outermost zone with a width of at most about 33 nanometers; and wherein said zone plate has an aspect ratio of at least about 48.

73. The method as recited in claim 72:

wherein said zone plate has an outermost zone with a width of at most about 10 nanometers; and wherein said zone plate has an aspect ratio of at least about 160.

74. The method as recited in claim 73:

wherein said zone plate has an outermost zone with a width of at most about 10 nanometers and at least about 5 nanometers; and wherein said zone plate has an aspect ratio of at least about 160 and at most about 1000.

* * * * *